United States Patent
Wasserbauer et al.

(10) Patent No.: US 6,618,414 B1
(45) Date of Patent: Sep. 9, 2003

(54) HYBRID VERTICAL CAVITY LASER WITH BURIED INTERFACE

(75) Inventors: John Wasserbauer, Erie, CO (US); Leo M. F. Chirovsky, Superior, CO (US)

(73) Assignee: Optical Communication Products, Inc., Chatsworth, CA (US)

(*) Notice: Subject to any disclaimer, the term of this patent is extended or adjusted under 35 U.S.C. 154(b) by 0 days.

(21) Appl. No.: 10/105,473

(22) Filed: Mar. 25, 2002

(51) Int. Cl.[7] .............................. H01S 3/08; H01S 5/00; H01L 21/00

(52) U.S. Cl. ........................ 372/45; 372/96; 438/22

(58) Field of Search .............................. 372/45, 46, 50, 372/96; 438/22

(56) References Cited

U.S. PATENT DOCUMENTS

| 5,245,622 A | * | 9/1993 | Jewell et al. ................. 372/45 |
| 5,594,751 A | * | 1/1997 | Scott ........................... 372/46 |
| 6,169,756 B1 | | 1/2001 | Chirovsky et al. |

* cited by examiner

*Primary Examiner*—Quyen Leung
(74) *Attorney, Agent, or Firm*—Barlow, Josephs & Holmes, Ltd.

(57) ABSTRACT

A vertical cavity laser includes an optical cavity adjacent to a first mirror, the optical cavity having a semiconductor portion and a dielectric spacer layer. A dielectric DBR is deposited adjacent to the dielectric spacer layer. The interface between the semiconductor portion of the optical cavity and the dielectric spacer layer is advantageously located at or near a null in the optical standing wave intensity pattern of the vertical cavity laser to reduce the losses or scattering associated with that interface.

30 Claims, 12 Drawing Sheets

HYBRID VERTICAL CAVITY LASER WITH BURIED INTERFACE

FIELD OF THE INVENTION

This invention generally relates to optoelectronic devices and more particularly relates to vertical cavity lasers (VCLs) having high reflectivity, and low loss dielectric or hybrid distributed Bragg reflectors.

BACKGROUND

A VCL is a semiconductor laser consisting of a semiconductor layer of optically active material, sandwiched between highly-reflective layers of metallic material, dielectric material, epitaxially-grown semiconductor material or combinations.

Conventional VCL designs utilize a thin active region, typically on the order of one wavelength of the emitted light, to achieve a low threshold current as well as longitudinal (or axial) mode control. However, thin active regions typically have a single pass optical gain of approximately 1%, so that upper and lower mirrors having reflectivities greater than about 99% are required to achieve lasing.

Conventional VCL designs often utilize semiconductor distributed Bragg reflectors (DBRs) to achieve the required reflectivities. DBRs as is known in the art comprise a plurality of pairs of quarter-wavelength thick layers, each pair comprising a relatively high refractive index layer adjacent a relatively lower refractive index layer. Depending on the refractive index difference between these layers, just a few pairs of layers can yield reflectivities greater than 90% over a wavelength range of several hundred nanometers.

In practice dielectric DBRs or hybrid DBRs comprising a semiconductor mirror portion and a dielectric mirror portion may provide significant advantages over semiconductor DBRs in terms of performance and manufacturability. For example, dielectric or hybrid DBRs may provide the same reflectivity with lower loss, higher efficiency and increased longitudinal optical confinement. Conventionally the index difference at the interface between the semiconductor and dielectric materials provides a high reflection but may also result in significant loss due to scattering at the interface or the presence of a highly doped or absorbing contact layer.

SUMMARY OF THE INVENTION

In an exemplary embodiment of the present invention a vertical cavity laser includes a hybrid optical cavity adjacent to a first mirror, the optical cavity comprising a semiconductor portion and a dielectric spacer layer. A dielectric DBR is disposed adjacent to the dielectric spacer layer. The interface between the semiconductor portion of the optical cavity and the dielectric spacer layer is at or near a null in the associated optical standing wave intensity pattern to reduce the losses or scattering associated with that interface.

In another aspect of the present invention a vertical cavity laser includes an optical cavity adjacent to a first mirror, a hybrid mirror having a semiconductor mirror adjacent to the optical cavity, a dielectric spacer layer adjacent to the semiconductor mirror and a dielectric DBR adjacent to the dielectric spacer layer, wherein the interface between the semiconductor portion of the hybrid mirror and the dielectric spacer layer is at or near a null in the optical standing wave intensity pattern.

In another aspect of the present invention a method for forming a vertical cavity laser includes the steps of forming a hybrid optical cavity adjacent to a first mirror, forming a dielectric spacer layer adjacent to the semiconductor portion of the optical cavity and forming a dielectric DBR adjacent to the dielectric spacer layer, wherein the interface between the semiconductor portion of the optical cavity and the dielectric spacer layer is at or near a null in the optical standing wave intensity pattern of the vertical cavity laser.

In a further aspect of the present invention an optical subassembly includes an electrical package containing a VCSEL. The VCSEL has a hybrid optical cavity adjacent to a first mirror, wherein a dielectric spacer layer is adjacent to the semiconductor portion of the optical cavity, and a dielectric DBR adjacent to the dielectric spacer layer, wherein an interface between the semiconductor portion of the optical cavity and the dielectric spacer layer is at or near a null in optical standing wave intensity pattern of the vertical cavity laser. The package may further include a housing attached to the electrical package, the housing including a ferule for aligning a fiber with an optical path carrying light from the VCSEL.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE INVENTION

Figure 1:
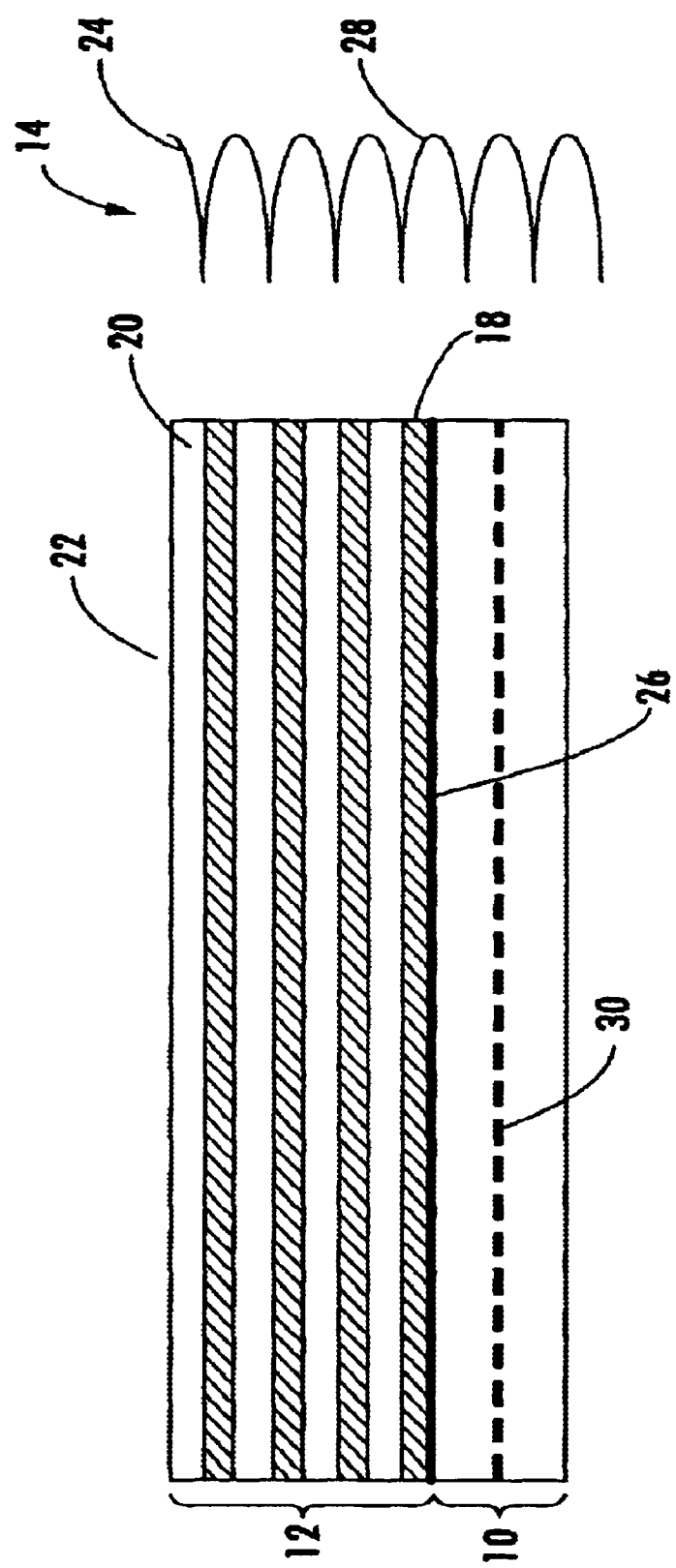
FIG. 1 is a cross sectional view of an optical cavity and upper mirror illustrating the optical standing wave intensity relative to vertical position within a typical VCL.

An exemplary embodiment of the present invention comprises a VCL having a low loss dielectric DBR or a hybrid DBR having a semiconductor portion and a dielectric portion. In accordance with an exemplary embodiment, the scattering or loss at the interface between the semiconductor material and dielectric material may be reduced by locating the interface at or near a null in the axial standing wave. The axial standing wave intensity corresponds to the intensity of the light in the VCL relative to the vertical position within the device. Hence, the standing wave maxima are where the light is most intense, and the standing wave minima are where the light is least intense. Therefore, optical loss and optical scattering may be reduced by placing lossy materials and or scattering sources at or near an axial standing-wave null.

The axial standing-wave pattern in a VCL is typically very well-defined due to the high reflectivity of the mirrors. For example, FIG. 1 graphically illustrates the structural details of a typical VCL optical cavity 10 and an upper dielectric DBR 12 as well as the corresponding standing wave intensity of the optical field 14 as a function of the vertical position within the structure. As is known in the art, a DBR typically comprises alternating layers of a low index of refraction material 18 and a high index of refraction material 20. In addition, in conventional VCL designs, a low index of refraction layer 18 is typically adjacent the optical cavity and the mirror typically terminates with a high index of refraction layer. Note that the standing wave pattern illustrations of the optical field 14 in FIG. 1 and the standing wave patterns in subsequent figures are meant to show the peak and null positions relative to device structure elements, and do not necessarily illustrate the relative standing wave intensities.

In operation, the large step down in the index of refraction at the interface 22 between the uppermost high index of refraction layer and free space creates a peak 24 in the optical standing wave at this interface. As is known in the art, mirror reflectivity may be increased by utilizing alternating mirror layers that have an optical thickness of one fourth of the wavelength of the light generated in the optical cavity. In addition, the alternating layers are typically stacked such that the peaks in the optical standing wave intensity are located at the high-to-low index steps as seen from the optical cavity.

The optical standing wave intensity of a typical VCL therefore, has a peak 28 at the interface 26 between the compound semiconductor optical cavity 10 and the upper dielectric DBR 12. Therefore, losses or scattering attributable to imperfections along the interface 26 are magnified, decreasing the reflectivity and or increasing the absorption of the mirror structures. In operation, the increased loss due to such scattering or absorption may prevent lasing in some VCL designs. Further, such loss cannot be compensated for by including additional pairs of layers in the DBR.

An exemplary embodiment of the present invention reduces the scattering or loss at the interface between a semiconductor structure, such as for example, an optical cavity and a dielectric structure, such as for example, a dielectric DBR, by locating the interface near a null in the axial standing wave. The advantages of the present invention may be best illustrated in the context of an exemplary VCL structure.

Figure 2:
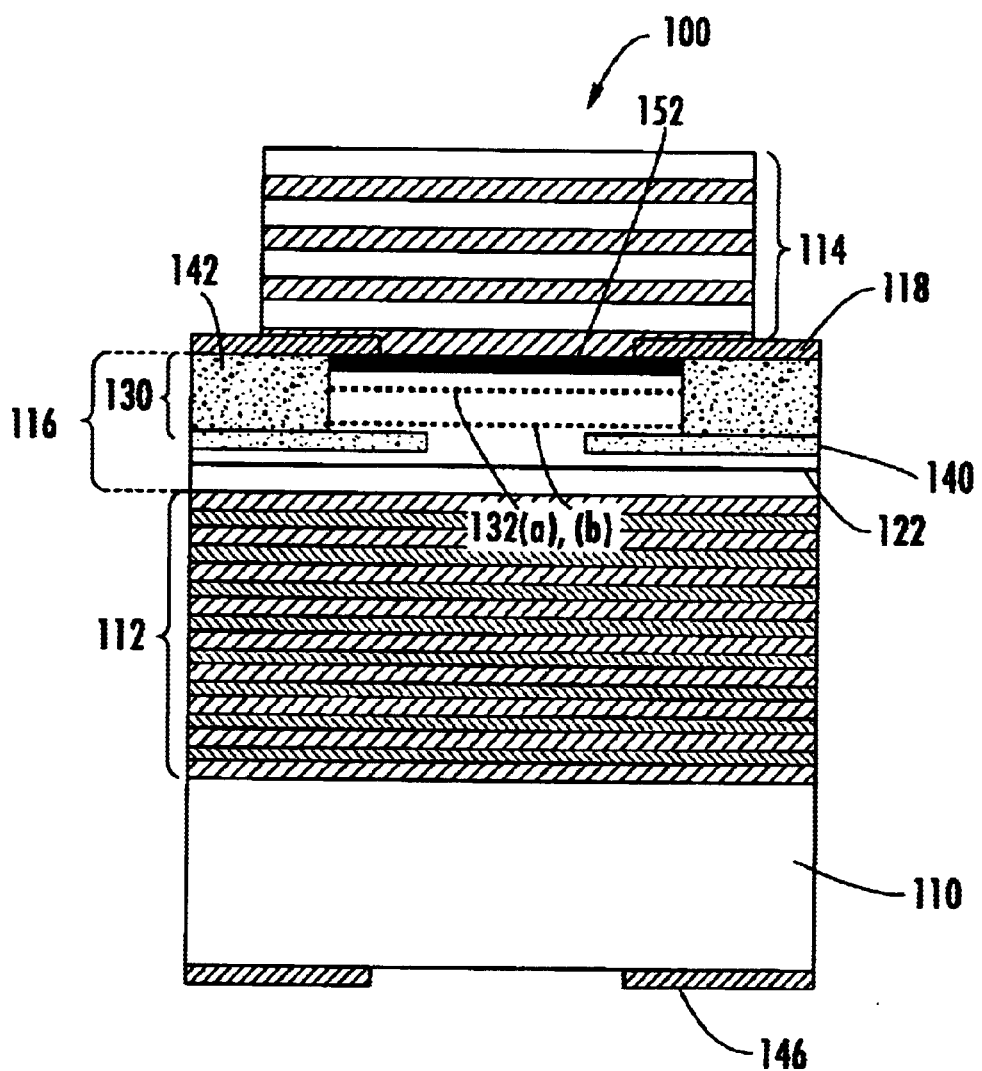
FIG. 2 is a cross sectional view of a VCL having an intra-cavity contact and a dielectric upper mirror without a spacer layer between the semiconductor portion of the optical cavity and the dielectric mirror such that the semiconductor/dielectric interface occurs at a peak in the optical standing wave intensity pattern allowing increased losses due to possible scattering at the interface and absorption just below the interface.

FIG. 2 illustrates a device without a spacer layer according to the present invention. The semiconductor light-emitting device 100 may comprise a lower mirror 112 adjacent a substrate 110, an upper mirror 114 above the lower mirror and an optical cavity 116, comprising a delta-doped cavity with an intra-cavity contact sandwiched between the upper and lower mirrors.

The lower mirror of the light emitting device may comprise a plurality of epitaxially grown compound semiconductor mirror periods. As is known in the art, the mirror periods may comprise one-quarter wavelength thick alternating layers of a high index of refraction material and a low index of refraction material. The lower mirror of such a device may often be doped n-type with a reflectivity of at least about 99%.

In operation, electrical current is conducted through an intra-cavity contact 118 (also referred to as an upper contact) and is laterally injected into the optical cavity 116 so that the upper mirror need not be conductive. Therefore, the upper mirror 114 may comprise a dielectric DBR formed from alternating one-quarter wavelength thick layers of a high index of refraction dielectric material and a low index of refraction dielectric material. For example, the upper mirror may comprise alternating layers of silicon nitride and silicon dioxide or other suitable dielectric materials. Advantageously, using an intra-cavity contact to laterally inject current into the optical cavity in combination with the dielectric DBR may reduce the series resistance and optical loss that may otherwise be associated with a doped semiconductor upper mirror.

The compound semiconductor optical cavity 116 may be epitaxially grown on the lower mirror 112. The optical cavity 116 has an optical thickness that is an integer multiple of one-half the wavelength of the light generated within the optical cavity. The optical cavity may include an active region having, for example, one or more quantum-wells 122 surrounded by barrier layers as may be preferable for the formation of the VCL device 100. The quantum-wells provide quantum confinement of electrons and holes therein to enhance recombination for the generation of the light, and may include semiconductor layers comprising a plurality of quantum wires, quantum dots or other suitable gain material.

In the described exemplary embodiment the optical cavity 116 may further comprise a delta-doped upper cladding layer 130 for conducting holes into the active region to cause lasing. The upper cladding layer 130 may be bulk doped with a suitable p-type dopant, such as, for example, C or Be at a relatively low density. For example, in an exemplary embodiment, the upper cladding layer may have a dopant concentration in the range of about $5 \times 10^{16}$–$1 \times 10^{18}$ cm$^{-3}$, to reduce absorption of light therein.

The delta-doped upper cladding layer 130 may include one or more p-type doping spikes 132(a) and 132(b) located at or near nulls in the optical standing wave pattern. In addition, in an exemplary embodiment there is a region (not specifically illustrated) of the delta-doped upper cladding layer 130 near the quantum wells that may not be doped. In the described exemplary embodiment the p-type doping spikes 132(a) and 132(b) have a thickness equal to or less than 30 nm, and are separated by a nominal thickness of λ/2n–30 nm, where n is the index of refraction of the cladding material.

In the described exemplary embodiment the concentration of the p-type doping spikes 132(a) and 132(b) may be on the order of about $2 \times 10^{19}$–$2 \times 10^{20}$ cm$^{-3}$. Advantageously, the placement of the p-type doping spikes, at or near the standing wave nulls where the optical losses are near zero, provides lateral conduction from the intra-cavity contact with reasonable resistance, without significantly compromising the optical efficiency. One of skill in the art will appreciate that the p-type doping spikes in the delta-doped upper cladding may not be necessary in some designs where device resistance is not a limiting constraint.

In accordance with an exemplary embodiment, the optical cavity may further comprise an n-type lower cladding layer (not explicitly shown) opposite the p-type upper cladding layer. In the described exemplary embodiment the lower cladding layer has no doping near the active region, but may have some continuous n-type doping closer to the lower mirror.

The VCL structure illustrated in FIG. 2 may be formed into discrete lasers by a combination of current confinement and ohmic contacts. Current confinement may be achieved by implanting hydrogen ions at multiple energy levels as is known in the art. Ion implantation in the regions 140 and 142 converts the implanted semiconductor layers to high resistivity. Alternatively, the region 140 could be produced by forming a mesa structure followed by wet oxidation of a suitable oxidizing layer as is known in the art. The encircling high resistance region 140 forms a funnel to provide a current confining aperture as is known in the art. Alternatively, additional current constriction may be achieved by forming a mesa structure with more than one oxide aperture.

The ion implanted region 142 can provide isolation between devices when there is no mesa structure and region 140 is implanted. Region 142 also reduces the capacitance of the device and enables higher speed performance when the aperture is produced by either implantation or by lateral oxidation.

The intra-cavity contact 118 (also termed upper contact) is disposed on the topmost surface of the delta-doped optical cavity 116 and inside the high resistance region 142 formed by the proton blocking implant. The bottom of the substrate 110 may include a contact metalization, forming an n-type ohmic contact 146. In one embodiment, the n-type ohmic contact 146 may form an annular aperture for backside monitoring of the output power. The n-type ohmic contact may be formed from AuGe/Ni/Ge or the like and may be deposited by electron beam evaporation or sputtering. The intra-cavity contact 118 may be, for example, gold with 2% beryllium (Au/Be) added or a layered structure of titanium/platinum/gold (Ti/Pt/Au), preferably deposited by electron beam evaporation.

In the described exemplary embodiment, the bulk doped p-type material of the delta-doped upper cladding layer 130 has a relatively low dopant concentration. The upper cladding layer may not have sufficient conductivity to provide a low resistance intra-cavity contact 118. Therefore, in one embodiment, a contact layer 152 may be deposited on the uppermost surface of the delta-doped cladding layer 130. The contact layer 152 is highly conductive, with a p-type doping density greater than about $1 \times 10^{19}$ cm$^{-3}$ and similar to doping spikes 132(a) and 132(b). The intra-cavity contact 118 may then be deposited on the more heavily doped contact layer 152. In accordance with an exemplary embodiment, the contact layer 152 and the doping spikes 132(a) and 132(b) may also act as current spreading layers, in that they are interspersed between much lower conducting layers, to provide a more uniform current distribution across the ohmic aperture, improving current injection into the active region of the optical cavity.

In a structure such as that shown in FIG. 2, the upper dielectric mirror 114 is formed adjacent to the delta-doped upper cladding layer 130 and the intra-cavity contact 118. Conventionally, a low index of refraction dielectric layer would be formed proximate the semiconductor optical cavity and therefore proximate the delta-doped upper cladding layer with the mirror terminating in a high index layer. Therefore, conventional structures result in the formation of a peak of the optical standing wave intensity pattern at the interface between the compound semiconductor optical cavity and the dielectric mirror as illustrated in FIG. 1. Further, losses from the highly doped contact layer and light scattering defects, such as for example non-smooth surfaces, are magnified in a conventional design.

Figure 3:
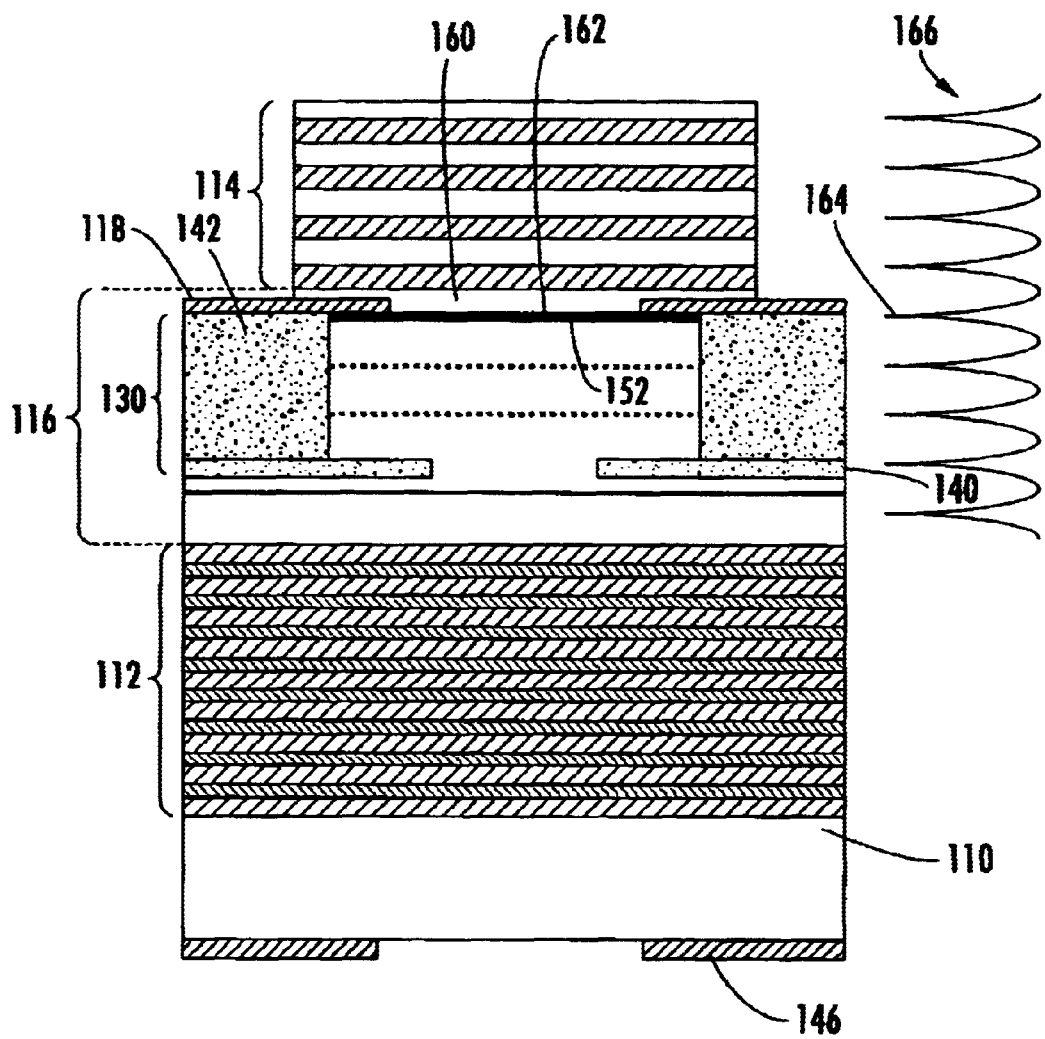
FIG. 3 is a cross-sectional view of the VCL of FIG. 2 including a high index of refraction dielectric spacer layer adjacent the delta-doped semiconductor portion of the optical cavity to place the undesirable interface between the compound semiconductor layers and the dielectric layers at a null in the standing wave intensity in accordance with an exemplary embodiment of the present invention.

In an exemplary embodiment of the present invention, a dielectric spacer layer 160 is formed adjacent to the delta-doped upper cladding layer, as illustrated in FIG. 3. In the described exemplary embodiment the dielectric upper mirror 114 may be formed above the dielectric spacer layer 160. The dielectric upper mirror 114 and the dielectric spacer layer 160 may then be etched to provide access to the intra-cavity contact 118.

Referring to the cross section of FIG. 3, the integration of the dielectric spacer layer 160 adjacent the compound semiconductor portion of the optical cavity functions to form a hybrid optical cavity 116. In accordance with an exemplary embodiment the undesirable interface 162 between the compound semiconductor portion of the optical cavity (including the contact layer 162) and the dielectric spacer layer 160 is relocated to be at or near a null 164 in the standing wave intensity pattern 166. Therefore, in operation the optical wave has reduced interaction with imperfections on the surface of the semiconductor material and experiences lower loss from the highly doped contact layer 152 formed thereon.

In the described exemplary embodiment the dielectric spacer layer 160 may be formed from the same material used to form the high index material component of the dielectric upper mirror. An exemplary dielectric spacer layer plus one-half of the thickness of contact layer 152 may have an optical thickness equaling one-fourth the wavelength of the light emitted by the device. However, additional dielectric material having an optical thickness approximately equal to an integer multiple of one half of the emission wavelength may be added to the dielectric spacer layer without changing its function.

In the described exemplary embodiment the finite thickness, highly doped contact layer 152 is contained completely within the optical cavity and is located symmetrically about the null in the optical field. One of skill in the art will appreciate that the thickness of the dielectric spacer layer 160 may be altered as a function of the optical thickness of the contact layer 152 to locate the contact layer asymmetrically about the null in the optical field. Further, the optical thickness of the semiconductor portion of the optical cavity may be approximately equal to $(N/2—¼)\lambda$, where N is an integer and $\lambda$ is the nominal wavelength of light emitted by the optical cavity, in order to accommodate a dielectric spacer layer 160 having an optical thickness of approximately ¼$\lambda$ and still achieve the desired lasing wavelength.

Figure 4:
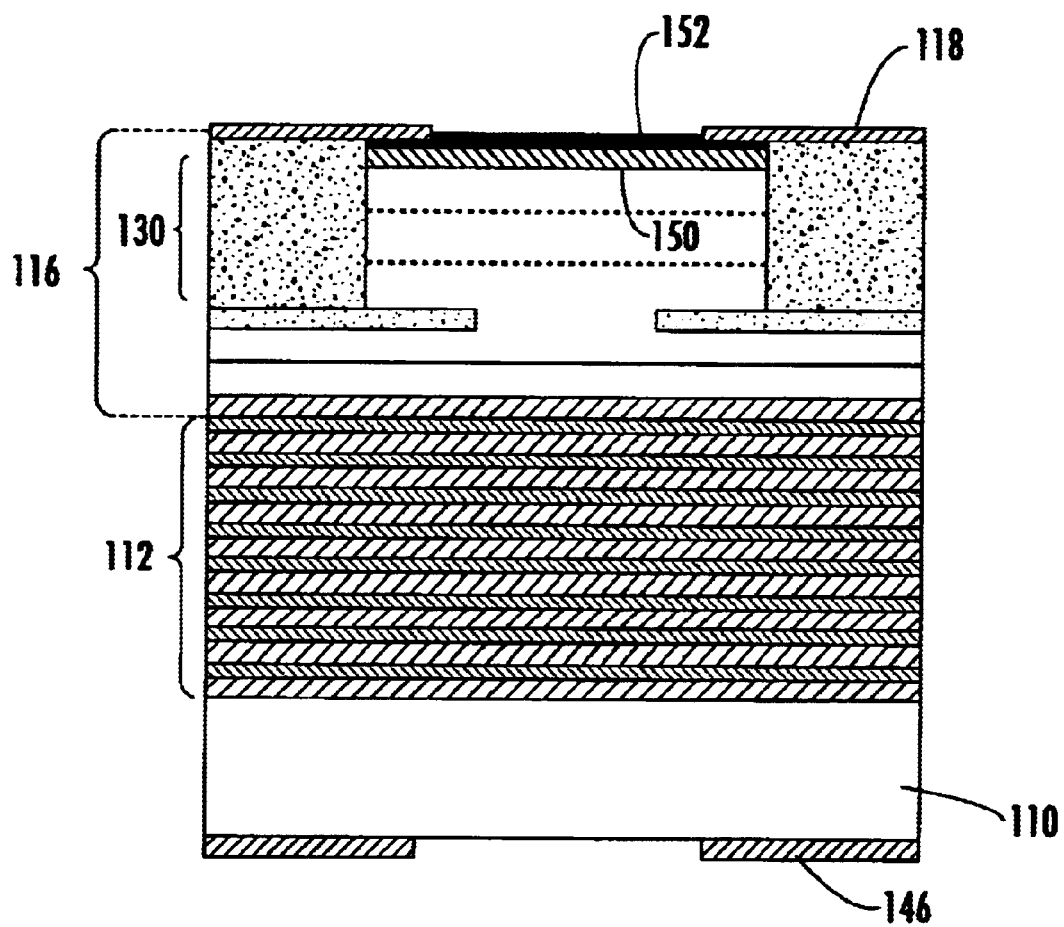
FIG. 4 is a cross-sectional view of the semiconductor portion of the VCL of FIG. 3 illustrating the use of an etch stop layer for selectively removing a highly doped contact layer on an upper surface of the delta-doped optical cavity in accordance with an exemplary embodiment of the present invention.

Alternatively, referring to FIG. 4 in another embodiment, a thin etch stop layer 150 (e.g., AlAs or InGaP) may be deposited on the uppermost surface of the delta-doped cladding layer 130 and the contact layer 152 may then be formed above the etch stop layer 150. In the described exemplary embodiment both layers are p-type doped with a density greater than about $1\times10^{19}$ $cm^{-3}$.

The intra-cavity contact 118 may then be formed on the more heavily doped contact layer 152. After the intra-cavity contact 118 is formed on the contact layer 152 the remaining exposed portion of the contact layer 152 may be selectively etched down to the etch stop layer 150 using, for example, a citric acid-based etchant if the etch stop layer is AlAs. The underlying etch stop layer 150 may then be selectively removed down to the uppermost surface of the delta-doped upper cladding layer 130 with a suitable etchant, such as, for example, a solution of hydrochloric acid, with ten percent water in the case of an AlAs etch stop layer.

Figure 5:
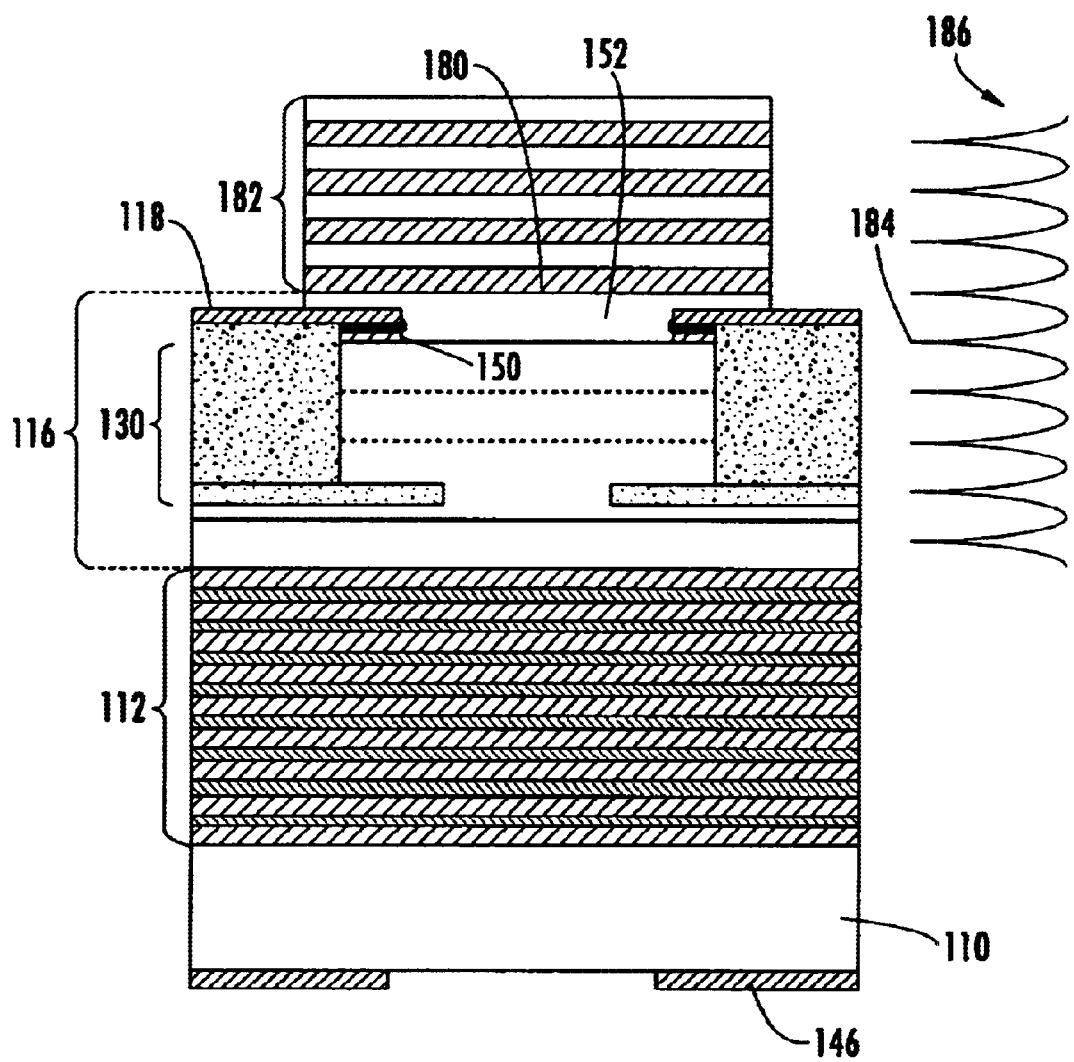
FIG. 5 is a cross-sectional view of the VCL of FIG. 3 with the highly doped contact layer and etch stop layers removed within the optical aperture and including a high index of refraction dielectric spacer layer adjacent the delta-doped semiconductor portion of the optical cavity to place the undesirable interface between the compound semiconductor layers and the dielectric layers at a null in the standing wave intensity in accordance with an exemplary embodiment of the present invention.

In this embodiment, a dielectric spacer layer 180 and dielectric upper mirror 182 may again be formed above the compound semiconductor portion of the optical cavity 116 as illustrated in FIG. 5. The dielectric spacer layer 180 may be formed from the material that is used to form the high index material component of the dielectric upper mirror. In accordance with an exemplary embodiment the dielectric spacer layer 180 may have an optical thickness equaling one-fourth the wavelength of the light emitted by the optical cavity. Additional dielectric material having an optical thickness equal to an integer multiple of one half of the emission wavelength may be added to this thickness without changing the function of the dielectric spacer layer.

In this embodiment, the interface between the compound semiconductor portion of the optical cavity and the dielectric spacer layer is again placed at or near a null 184 in the standing wave intensity pattern 186. Therefore, losses from light scattering defects, such as for example surface roughening that may result from the etch back processing step, are reduced.

Figure 6:
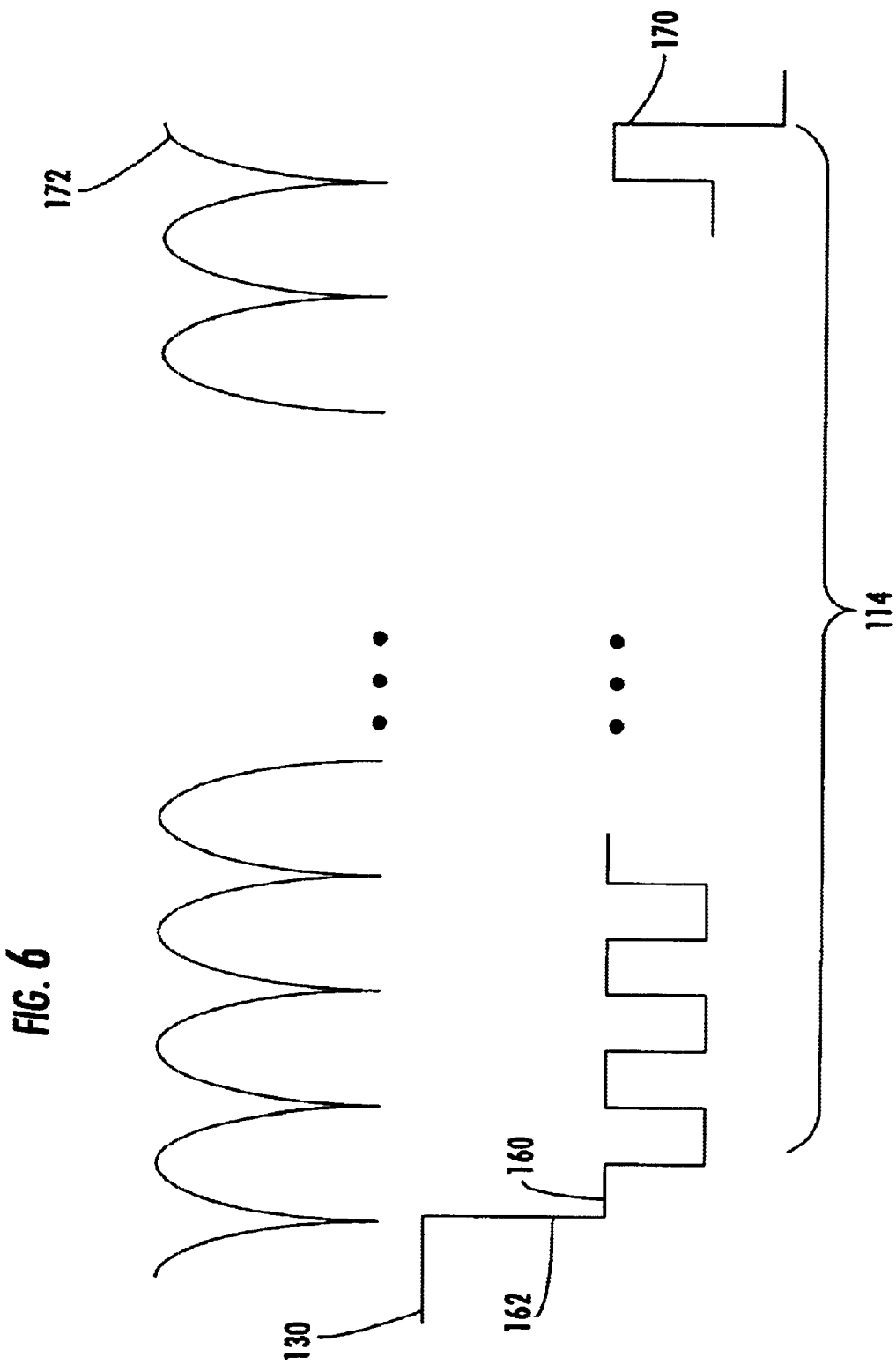
FIG. 6 graphically illustrates the index of refraction and standing wave intensity of the VCL of FIG. 5 as a function of vertical distance within the device in accordance with an exemplary embodiment of the present invention.

FIG. 6 graphically illustrates the index of refraction and corresponding optical intensity pattern 166 of the intra-cavity VCL illustrated in FIG. 3, as a function of vertical position within the device. In the described exemplary embodiment the dielectric spacer layer 160 is formed adjacent the delta-doped upper cladding layer 130 and the dielectric upper mirror 114, comprising a plurality of mirror periods, is formed adjacent the dielectric spacer layer. In the described exemplary embodiment the dielectric spacer layer 160 may be formed from the material used to form the high index component of the dielectric upper mirror.

In the described exemplary embodiment the dielectric upper mirror terminates in a high index layer creating a maximum 172 in the optical standing wave intensity pattern at the interface 170 between the mirror and free space. Further, the maxima in the optical standing wave intensity are located at the high-to-low index steps to increase mirror reflectivity. One of skill in the art will appreciate that the thickness and composition of the mirror termination layer may be modified to reduce the reflectivity of the upper mirror and that the current illustration provides for the maximum reflectivity for a given number of mirror periods.

In accordance with an exemplary embodiment, the index of refraction of the semiconductor delta-doped upper cladding layer 130 is higher than the index of refraction of the dielectric spacer layer 160. Therefore, the index of refraction transitions from high to low at the interface 162 between the delta-doped upper cladding 130 and the dielectric spacer layer 160. Normally, such a transition would draw a maximum in the standing wave pattern. However, the hybrid cavity extension formed by the integration of the dielectric spacer layer 160 functions to locate the interface 162 between the upper delta-doped cladding 130 and the dielectric spacer layer 160 at or near a null in the standing wave intensity pattern.

One of skill in the art will appreciate that the present invention is not limited to a particular material system or emission wavelength. Rather, the compound semiconductor layers of the described exemplary light-emitting device may be formed from a variety of group III–V or II–VI compound semiconductors, such as, for example, GaAs/AlGaAs, InGaAs/AlGaAs or InP/InGaAsP or other direct bandgap semiconductor materials. Similarly, the dielectric DBR may be formed from any of a variety of dielectric mirror systems known in the art, such as, for example, silicon nitride and silicon dioxide, silicon carbide/silicon oxicarbide, magnesium oxide/magnesium fluoride, silicon dioxide/titanium dioxide or other material systems.

One of skill in the art will further appreciate that the dielectric spacer layer 160 is not limited to ¼$\lambda$ layers of the high index component of a dielectric DBR pair. For example, referring to FIG. 7, in an alternate embodiment a dielectric spacer layer 200 may be formed from the material used to form the low index material component of the upper dielectric DBR 214. In this embodiment the dielectric spacer layer 200 may have a thickness approximately equal to an integer multiple of one-half the wavelength of the light emitted by the device. The dielectric spacer layer 200 again functions to extend the cavity and to relocate the undesirable interface 202 between the compound semiconductor portion of the optical cavity and the dielectric material to be at or near a null 204 in the standing wave intensity pattern 206.

Figure 7:
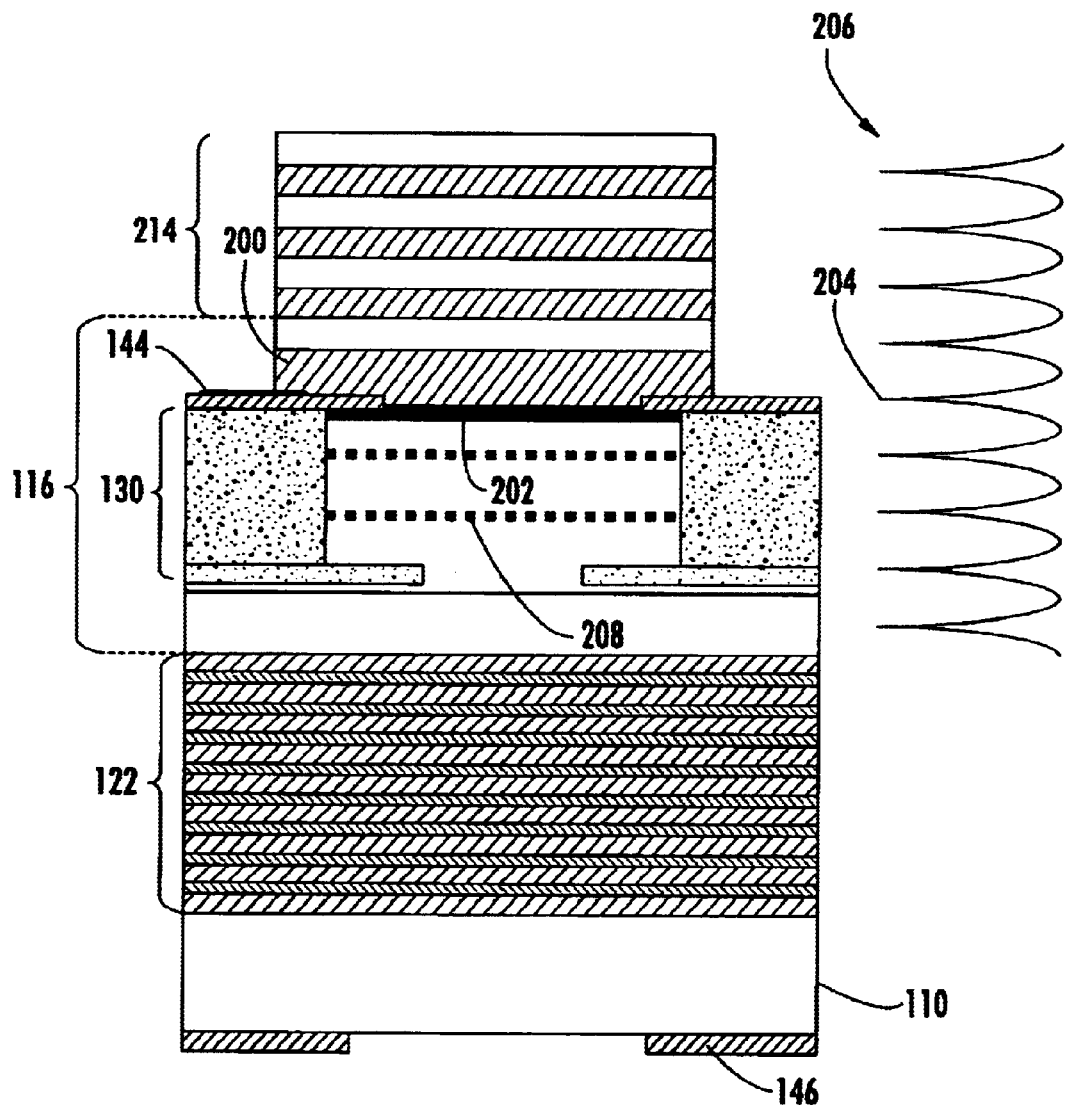
FIG. 7 is a cross-sectional view of the VCL of FIG. 2 including a low index of refraction dielectric spacer layer adjacent the delta-doped semiconductor portion of the optical cavity to place the undesirable interface between the compound semiconductor layers and the dielectric layers at a null in the standing wave intensity in accordance with an exemplary embodiment of the present invention.
Figure 8:
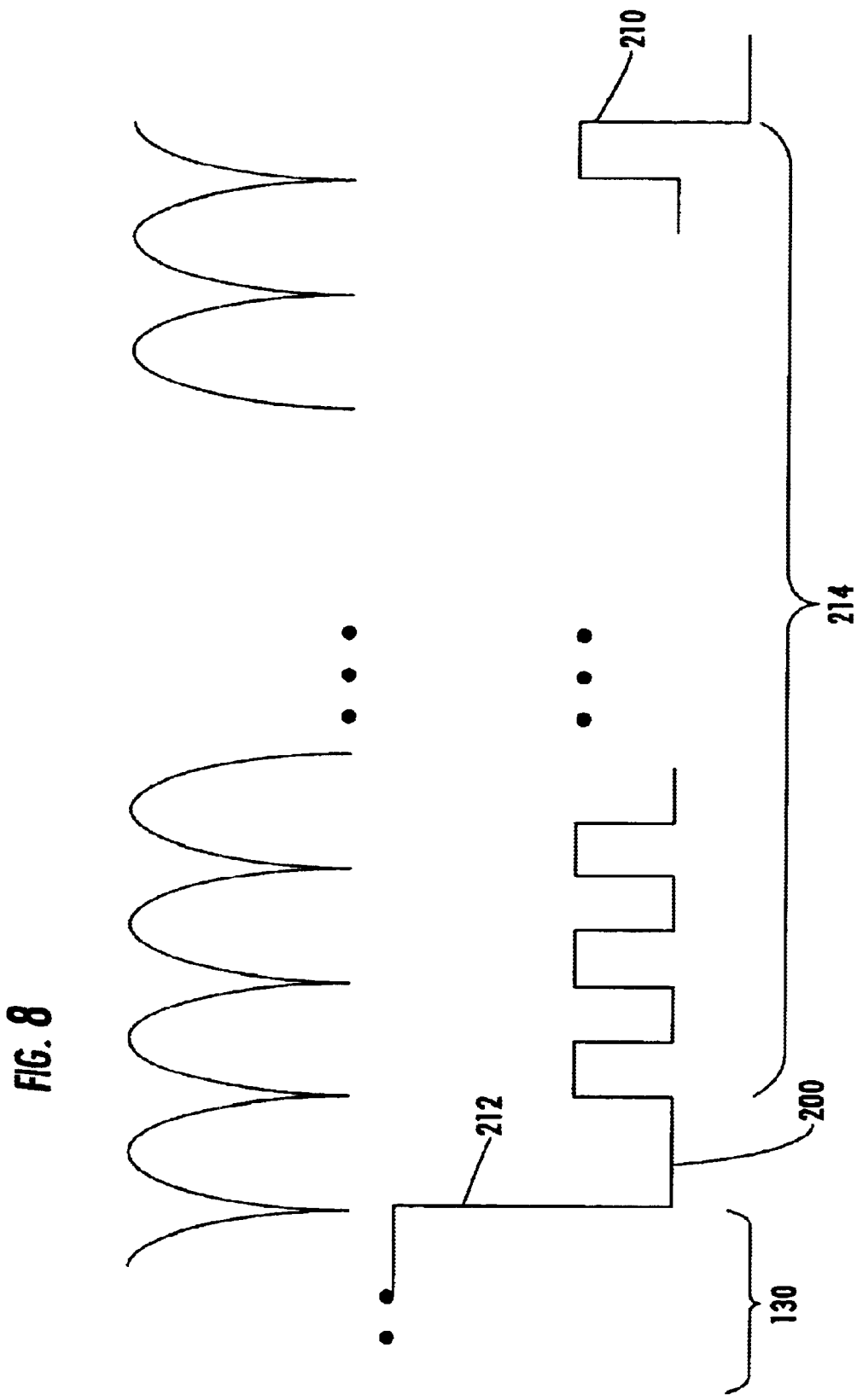
FIG. 8 graphically illustrates the index of refraction and standing wave intensity of the VCL of FIG. 7 as a function of vertical distance within the device in accordance with an exemplary embodiment of the present invention.

FIG. 8 graphically illustrates the index of refraction and corresponding optical standing wave intensity pattern of the intra-cavity VCL illustrated in FIG. 7, as a function of vertical position within the device. In the described exemplary embodiment the dielectric spacer layer 200 is formed adjacent the delta-doped upper cladding layer 130 and the dielectric upper mirror 214, comprising a plurality of mirror periods, is formed adjacent the dielectric spacer layer.

In the described exemplary embodiment the dielectric spacer layer 200 may be formed from the material used to form the low index component of the dielectric upper mirror 214. The dielectric upper mirror terminates in a high index layer creating a maximum in the optical standing wave intensity pattern at the interface 210 between the mirror and free space. Further, in the described exemplary embodiment, the maxima in the optical standing wave intensity are located at the high-to-low index steps to increase mirror reflectivity. One of skill in the art will appreciate that the thickness and composition of the mirror termination layer may be modified to reduce the reflectivity of the upper mirror and that the current illustration provides for the maximum reflectivity for a given number of mirror periods.

In accordance with an exemplary embodiment, the index of refraction of the semiconductor delta-doped upper cladding layer 130 is again higher than the index of refraction of the dielectric spacer layer 200. Therefore, the index of refraction transitions from high to low at the interface 212 between the delta-doped upper cladding 130 and the dielectric spacer layer 200. Normally, such a transition would draw a maximum in the standing wave intensity pattern. However, the hybrid cavity extension formed by the integration of the dielectric spacer layer 200 again functions to locate the interface 212 between the upper delta-doped cladding 130 and the dielectric spacer layer 200 at or near a null in the standing wave intensity pattern.

One of skill in the art will also appreciate that the present invention is not limited to VCLs having an all dielectric upper mirror. Rather the present invention may be utilized to lower the loss at the interface between the semiconductor portion and dielectric portion of a hybrid mirror. For example, referring to FIG. 9 an illustrative VCL 300 may comprise a lower mirror 320 formed adjacent a substrate 310, an optical cavity 330 formed adjacent the lower mirror and a hybrid upper mirror 340 formed adjacent the optical cavity.

In the described exemplary embodiment the lower mirror 320 may comprise a multi-layered distributed Bragg reflector, (DBR) as is conventional in the art. In an exemplary embodiment, the lower mirror may comprise alternating layers of a low index of refraction and high index of refraction semiconductor material, such as for example, AlGaAs/AlAs. The lower mirror may be doped n-type with a suitable dopant such as for example silicon.

Figures 9, 10:
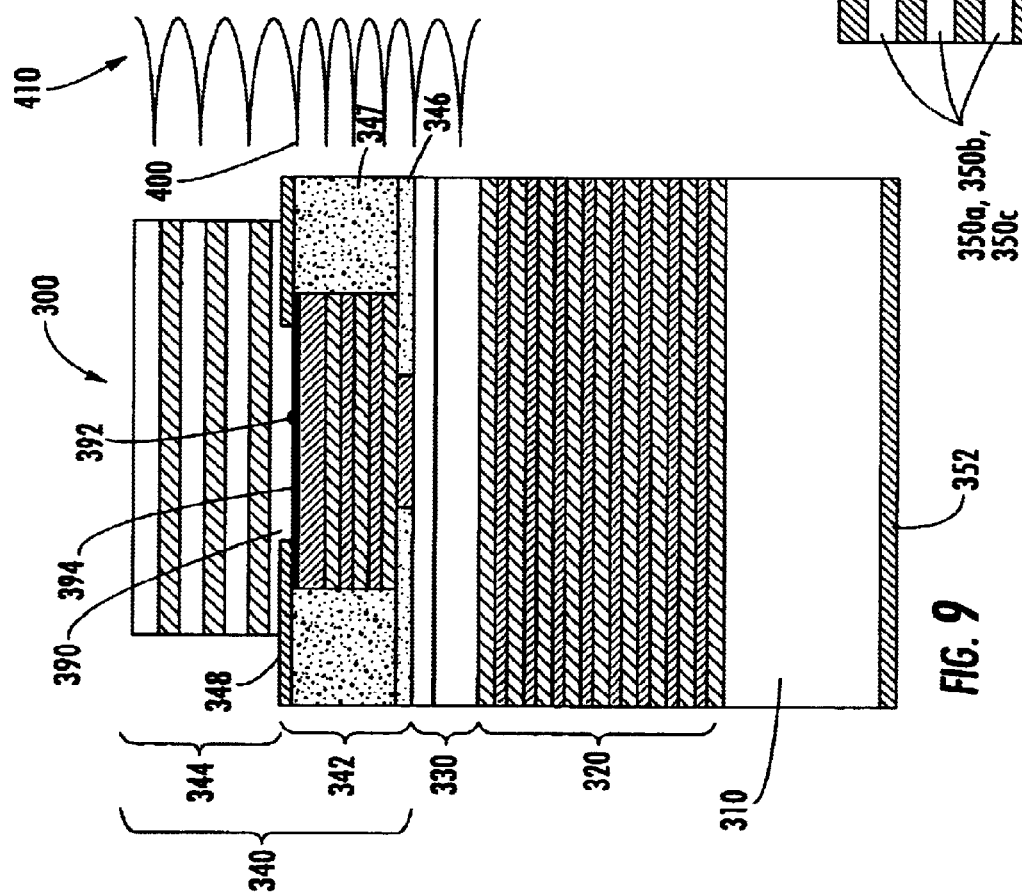
FIG. 9 is a cross-sectional view of a VCL having a hybrid upper mirror with a high index of refraction dielectric spacer layer sandwiched between a semiconductor mirror portion and a dielectric mirror portion in accordance with an exemplary embodiment of the present invention.
FIG. 10 is a cross-sectional view of the compound semiconductor optical cavity of the VCL of FIG. 9 in accordance with an exemplary embodiment of the present invention.

Referring to FIG. 10, in the described exemplary embodiment a compound semiconductor optical cavity 330 may be epitaxially grown on the lower mirror (not shown). The optical cavity may include an active region having, for example, one or more quantum-wells 350a, 350b, 350c surrounded by barrier layers 360a and 360b as may be preferable for the formation of the VCL device 300. In the described exemplary embodiment, the quantum wells and barrier layers may be sandwiched between upper and lower cladding layers 370 and 380 respectively. The barrier layers preferably have an energy bandgap greater than the energy bandgaps of the quantum-well layers.

The quantum-wells provide quantum confinement of electrons and holes therein to enhance recombination for the generation of light, and may also include semiconductor layers comprising a plurality of quantum wires, quantum dots or other suitable gain material. As is generally understood in the art, the number of and materials forming the quantum wells 350a, 350b and 35c and surrounding barrier layers 360a, 360b may be varied depending on the design. The compound semiconductor optical cavity may be formed from a variety of group III–V or II–VI compound semiconductors, such as, for example, GaAs/AlGaAs, InGaAs/AlGaAs or InP/InGaAsP or other direct bandgap semiconductor materials known in the art.

Referring back to FIG. 9, the described exemplary embodiment includes a hybrid upper mirror 340 having a semiconductor mirror portion 342 and a dielectric mirror portion 344. In practice, the number of layers in the semiconductor mirror portion 342 is reduced as compared to a conventional VCL. The dielectric mirror portion 344 compensates for the reduced number of layers in the semiconductor mirror portion 342. In the described exemplary embodiment, the hybrid mirror satisfies the standard overall VCL mirror reflectivity requirements known to those skilled in the art.

The semiconductor mirror portion 342 of the hybrid upper mirror may comprise alternating layers of a low index of refraction and high index of refraction semiconductor material, such as for example, AlGaAs/AlAs. The upper mirror may be doped p-type with a suitable dopant such as for example carbon. The semiconductor mirror portion 342 of the hybrid upper mirror may terminate with a highly-doped contact layer 394 that may be used to reduce the contact resistance of upper ohmic contact 348.

The dielectric mirror portion 344 of the hybrid mirror may comprise alternating one-quarter wavelength thick layers of a high index of refraction dielectric material (e.g., silicon nitride) and a low index of refraction dielectric material (e.g., silicon dioxide). The alternating layers of the dielectric mirror portion 344 may be patterned either by etching or liftoff processes known to those skilled in the art. In an exemplary embodiment the hybrid mirror may further comprise a dielectric spacer layer 390 sandwiched between the semiconductor mirror portion 342 and dielectric mirror portion 344 of the hybrid mirror 340.

In accordance with an exemplary embodiment the dielectric spacer layer 390 may be formed from the material used to form the high index material component of the dielectric upper mirror 344. An exemplary dielectric spacer layer 390 may have an optical thickness equaling approximately one-fourth the wavelength of the light emitted by the device. One of skill in the art will again appreciate that the thickness of the dielectric spacer layer may be varied to symmetrically locate the highly doped contact layer 394 at or near a null in the optical standing wave intensity pattern.

Also, additional dielectric material having a thickness equal to an integer multiple of one half of the emission wavelength may be added to this thickness without changing the function of the dielectric spacer layer. In addition, in the described exemplary embodiment the last layer of the semiconductor mirror portion 342 of the hybrid mirror may have an optical thickness of approximately one-half of a wavelength to compensate for the addition of a spacer layer 390.

The integration of the dielectric spacer layer 390 adjacent the semiconductor mirror portion 342 of the hybrid mirror 340 functions to form a cavity within the upper mirror. In accordance with an exemplary embodiment the undesirable interface 392 between the compound semiconductor mirror portion 342 and the dielectric mirror portion 344 of the hybrid mirror (and possibly the highly-doped contact layer 394) is located at or near a null in the standing wave intensity pattern within the cavity formed in the mirror. Therefore, in operation the optical standing wave has reduced interaction with imperfections or lossy material on the surface of the semiconductor mirror portion of the hybrid mirror and therefore experiences lower loss therefrom.

The described exemplary VCSEL may be formed into discrete lasers by a combination of current confinement and ohmic contacts. Current constriction may be achieved by implanting hydrogen ions at multiple energy levels as is known in the art. Ion implantation converts regions 346 and 347 of the semiconductor portion 342 of the hybrid mirror 340 to high resistivity. The encircling high resistance region 346 forms a funnel to provide current confinement as is known in the art. Other techniques for current constriction, such as selective AlAs oxidation, are also applicable. The encircling high resistance implanted region 347 may provide isolation and capacitance reduction.

In the described exemplary embodiment an upper ohmic contact 348 is disposed on the uppermost surface of the semiconductor mirror portion 342 of the hybrid mirror with an aperture inside the proton implanted region 347, providing a ring contact. The bottom of the substrate 310 may also include a contact metalization, forming an n-type ohmic contact 352. The n-type ohmic contact may be, for example, eutectic gold germanium deposited by electron beam evaporation or sputtering. The upper ohmic contact 348 may be, for example, gold with 2% beryllium added or a layered structure formed from titanium/platinum/gold. The upper ohmic contact may be deposited by electron beam evaporation.

In the described exemplary embodiment the dielectric spacer layer and dielectric mirror portion of the hybrid mirror may then be deposited above the semiconductor mirror portion of the hybrid mirror. The dielectric mirror portion 344 of the hybrid mirror and the dielectric spacer layer 390 may be etched to provide access to the upper ohmic contact 348.

Figure 11:
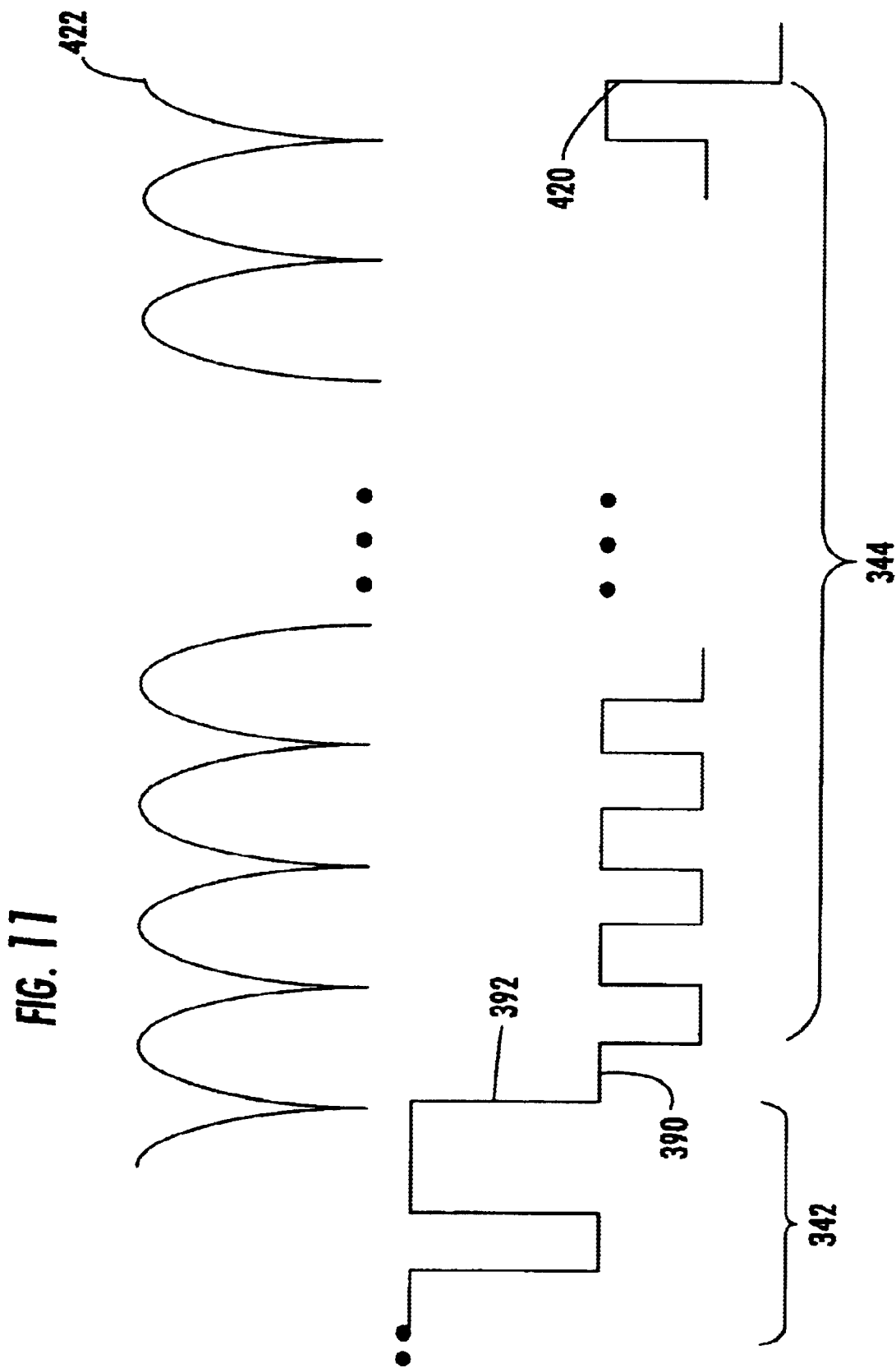
FIG. 11 graphically illustrates the index of refraction and standing wave intensity of the upper mirror of the VCL of FIG. 9 as a function of vertical distance within the device in accordance with an exemplary embodiment of the present invention.

FIG. 11 graphically illustrates the index of refraction of the described exemplary hybrid mirror of FIG. 9 and the corresponding standing wave pattern as a function of vertical position within the device. In the described exemplary embodiment the dielectric spacer layer 390 is formed adjacent the semiconductor mirror portion 342 of the hybrid mirror. In the described exemplary embodiment the dielectric portion 344 of the hybrid mirror, comprising a plurality of mirror periods, is formed adjacent the dielectric spacer layer 390.

In the described exemplary embodiment the dielectric spacer layer may be formed from the material used to form the high index material component of the dielectric mirror portion of the hybrid mirror. The dielectric mirror portion terminates with a high index layer creating a maximum 422 in the optical standing wave intensity pattern at the interface 420 between the mirror and free space. Further, the maxima in the optical standing wave intensity are again located at the high-to-low index steps to maximize mirror reflectivity.

In accordance with an exemplary embodiment, the index of refraction of the semiconductor mirror portion 342 of the hybrid mirror is generally higher than the index of refraction of the dielectric spacer layer 390. Therefore, the index of refraction transitions from high to low at the interface 392 between the semiconductor mirror portion 342 of the hybrid mirror and the dielectric spacer layer 390. Normally, such a transition would draw a maximum in the standing wave intensity pattern. However, the integration of the dielectric spacer layer 390 functions to locate the interface 392 between the semiconductor mirror portion 342 of the hybrid mirror and the dielectric spacer layer 390 at or near a null in the standing wave intensity pattern. Therefore, in operation the optical wave has reduced interaction with imperfections or lossy material on the surface of the semiconductor mirror portion of the hybrid mirror and therefore experiences lower loss therefrom.

One of skill in the art will further appreciate that the dielectric spacer layer as applied in a hybrid mirror is not limited to ¼λ layers of the high index component of a dielectric DBR pair. In an alternate embodiment the dielectric spacer layer may be formed from the material used to form the low index material component of the dielectric portion 344 of the hybrid mirror. In this embodiment the thickness of the dielectric spacer layer 390 may be an integer multiple of one-half the wavelength of the light emitted by the device, in much the same way as implemented in FIGS. 7 & 8.

One of skill in the art will also appreciate that the present invention is not limited to particular material systems or emission wavelengths. Rather, the compound semiconductor layers of the described exemplary light-emitting device may be formed from a variety of group III–V or II–VI compound semiconductors, such as, for example, GaAs/AlGaAs, InGaAs/AlGaAs or InP/InGaAsP or other direct bandgap semiconductor materials. Similarly, the dielectric DBR may be formed from any of a variety of dielectric mirror systems known in the art, such as, for example, silicon nitride and silicon dioxide, silicon carbide/silicon oxicarbide, magnesium oxide/magnesium fluoride, titanium dioxide/silicon dioxide or other material systems.

Figure 12:
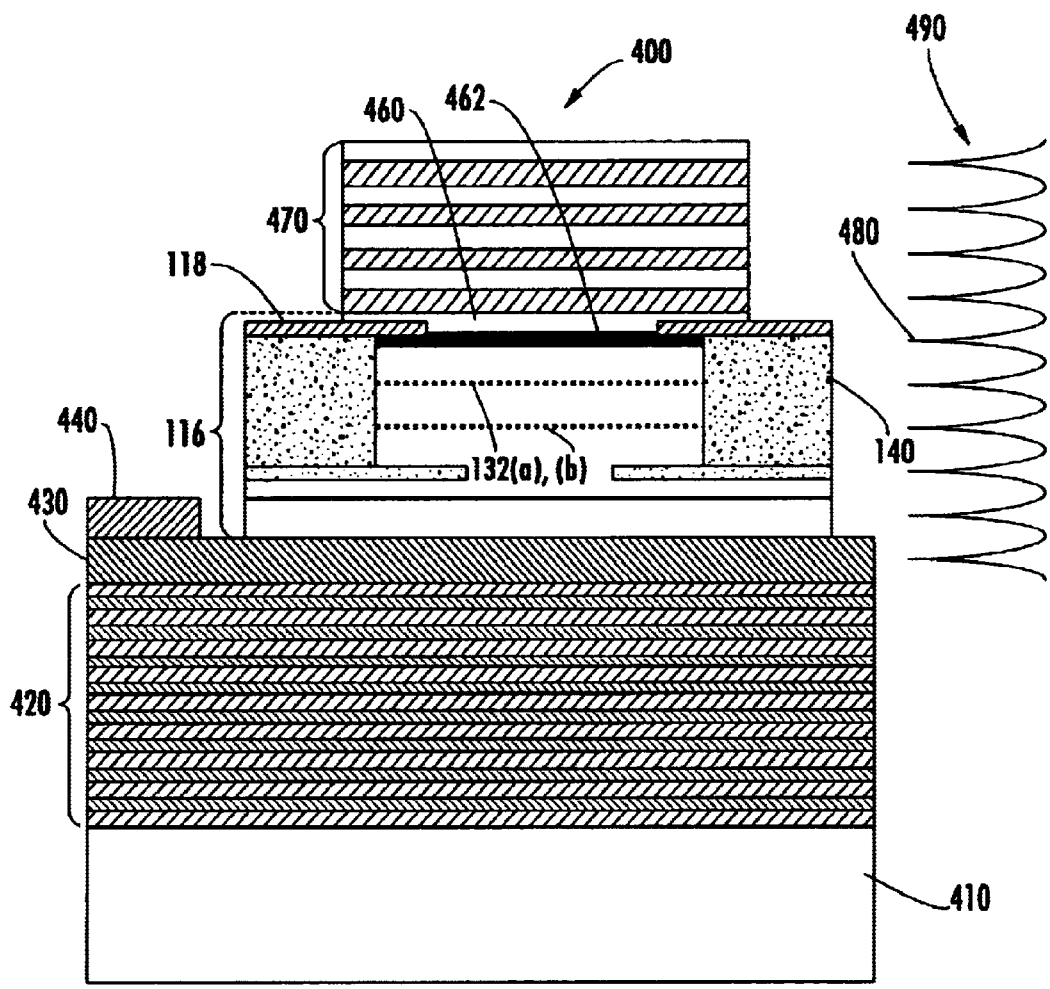
FIG. 12 is a cross-sectional view of a VCL having a p-type and an n-type intra-cavity contact and a dielectric upper mirror with a spacer layer between the semiconductor portion of the optical cavity and the dielectric mirror to relocate the semiconductor dielectric interface to be at or near a null in the optical standing wave intensity pattern in accordance with an exemplary embodiment of the present invention.

Although exemplary embodiments of the present invention have been described, they should not be construed to limit the scope of the appended claims. Those skilled in the art will understand that various modifications may be made to the described embodiments. For example, the present invention may be utilized with a high speed device 400 having a semi-insulating substrate 410 and an un-doped lower mirror 420 as illustrated in FIG. 12.

In the described exemplary embodiment, the lower mirror 420 is formed above a semi-insulating substrate 410 and an n-type contact layer 430 may be formed above the lower mirror stack 420 and below an optical cavity 116. Further an upper mirror 470 may be formed above the optical cavity. In accordance with an exemplary embodiment the upper and lower mirrors are highly reflective, having greater than 99% reflectivity. Conventionally, semiconductor DBRs are lossy with corresponding 1 lower reflectivity if doped. In practice, the mirror loss generally increases with increasing doping density. However, if a conventional DBR is not sufficiently doped, the mirror may be highly resistive with significant levels of self-heating that may impair the performance of the device.

For example, the operating performance of a VCL (slope efficiency and threshold) typically varies as a function of temperature. In addition, long term laser reliability may also be compromised in high resistivity devices. Therefore, in the described exemplary embodiment, the upper and lower mirror stacks and the intra-cavity doped layers are designed to reduce the voltage drops as well as the loss or absorption associated with conduction through the mirror stacks.

For example, an exemplary embodiment of the present invention includes an intracavity n-type contact 440 for injecting electrons into an active region of the optical cavity. In one embodiment, the intra-cavity n-type contact may be electrically coupled to the contact layer 430. In an exemplary embodiment the intra-cavity n-type contact 440 may be formed, for example, by depositing an n-type metalization such as AuGe/Ni/Au on the upper surface of the contact layer. The series resistance of the described exemplary VCL 400 is reduced by having the intra-cavity n-type contact 440 close to the optical cavity 116, thus reducing the series voltage across the VCL by avoiding conduction through the lower mirror stack.

In an exemplary embodiment, the lower mirror may therefore comprise alternating layers of un-doped binary pairs of a high index of refraction material, such as, for example GaAs and a low index of refraction material, such as, for example AlAs, formed on the semi-insulating substrate 410. Advantageously, the utilization of binary pairs having a 100% concentration of Al reduces the overall thermal impedance of the mirror. One or both layers in each pair may also be ternary as may be appropriate for other design constraints.

The intra-cavity contact layer 430 may comprise a layer of n-type semiconductor material, such as for example, GaAs, with a silicon dopant. In accordance with an exemplary embodiment the contact layer may include a constant doped region with a concentration in the range of about $5 \times 10^{17} – 3 \times 10^{18}$ cm$^{-3}$ and one or more n-type doping spikes having a concentration in the range of about $5 \times 10^{18} – 1 \times 10^{19}$ cm$^{-3}$ to reduce the lateral resistance created by the electrical connection. One of skill in the art will appreciate that the doping spikes in this contact layer may not be required if the lateral resistance created by the electrical connection is not a limiting factor in the design of an exemplary VCL.

The described exemplary embodiment may further include additional portions of an optical cavity 116 having an active region and a delta-doped upper cladding and p-type intra-cavity contact as previously described with respect to FIG. 2. In operation, electrical current is again conducted through the p-type intra-cavity contact 118 into the optical cavity 116 so that the upper mirror need not be conductive reducing the overall resistance and loss of the device. The p-type intra-cavity contact may be formed, for example, by depositing a p-type metalization, such as gold with 2% beryllium added or a layered structure of titanium/platinum/gold above the upper mirror stack defining an annular opening therein by a lithographic masking and lift-off process. The intra-cavity contact may be deposited by electron beam evaporation.

In accordance with an exemplary embodiment a dielectric spacer layer 460 and upper mirror 470 may again be formed adjacent the semiconductor optical cavity. The upper mirror 470 may comprise a dielectric DBR as previously described with respect to FIG. 2. The dielectric upper mirror 470 and the dielectric spacer layer 460 may then be etched to provide access to the p-type intra-cavity contact 118.

In the described exemplary embodiment the dielectric spacer layer 460 may be formed from the material used to form the high index material component of the dielectric upper mirror 470. The optical thickness of the spacer layer is approximately one-fourth the wavelength of the light emitted by the device to relocate the undesirable interface 462 between the compound semiconductor optical cavity and the dielectric spacer layer to be at or near a null 480 in the standing wave intensity pattern 490. Therefore, in operation the optical wave has reduced interaction with the imperfections on the surface of the semiconductor material and experiences lower loss from the highly doped contact layer formed thereon.

Figure 13:
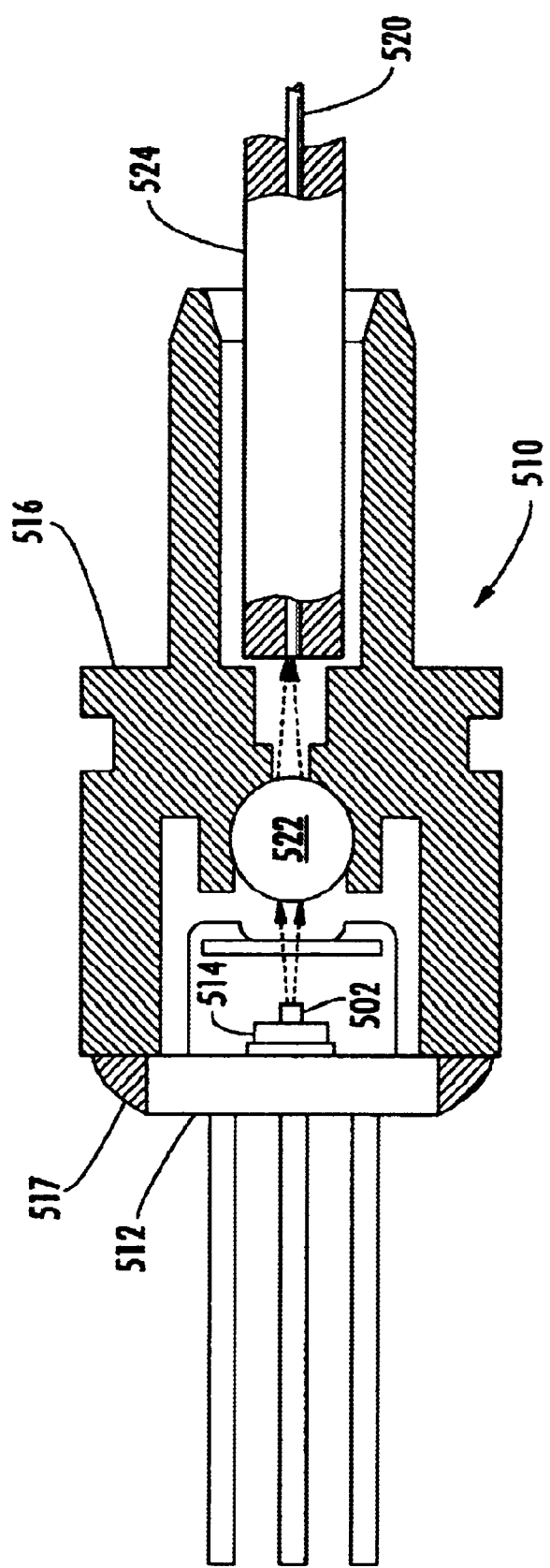
FIG. 13 is a side view, partly in cross-section, of an optical subassembly incorporating a VCSEL having a low loss, high reflectivity output mirror in accordance with an exemplary embodiment of the present invention.

FIG. 13 illustrates the integration of an exemplary VCSEL as illustrated in FIGS. 2, 3, 5, 7, 9 or 12, mounted into an optical subassembly (OSA) 510. The OSA enables application of DC biasing and AC modulation signals to the VCSEL. The OSA generally comprises an electrical package 512 containing the VCSEL 502 and a power monitoring photodetector 514.

The electrical package may be bonded to a precision molded plastic housing 516. The bonding process, including conventional bonding material 517 may involve active alignment to optimize the coupling of the laser light into an optical fiber 520, as is conventional in the art. The described exemplary OSA may include a focusing element, such as, for example, a ball lens 522 for coupling the light into the optical fiber. A ferule 524 provides alignment of the optical fiber. After the electrical package 512 and housing 516 are bonded together, the fiber is removed and the OSA 525 is complete. An exemplary optical subassembly is also described in U.S. patent application Ser. No. 08/900,507, filed Jul. 25, 1997, the contents of which are hereby incorporated by reference.

The incorporation of a low loss, high reflectivity upper DBR into the VCSEL 502, provides for more toleration of surface imperfections due to device processing as well as the integration of lossy materials for contacting the device. The low loss, high reflectivity mirror reduces manufacturing complexity and increases yield, thereby resulting in lower overall product cost.

The previous description of the disclosed embodiments is provided to enable any person skilled in the art to make or use the present invention. Various modifications to these embodiments will be readily apparent to those skilled in the art, and the general principles defined herein may be applied to other embodiments without departing from the spirit or scope of the invention. It is therefore desired that the present embodiments be considered in all respects as illustrative and not restrictive, reference being made to the appended claims rather than the foregoing description to indicate the scope of the invention.

What is claimed is:

1. A vertical cavity laser, comprising:

a first mirror;

an optical cavity having a dielectric spacer layer portion and a semiconductor portion, the semiconductor portion adjacent to the first mirror; and a dielectric DBR adjacent to the dielectric spacer layer, wherein an interface between the semiconductor portion of the optical cavity and the dielectric spacer layer is at or near a null in the optical standing wave intensity pattern of said vertical cavity laser.

2. The vertical cavity laser of claim 1 wherein the dielectric DBR comprises alternating layers of a high index of refraction dielectric material and a low index of refraction dielectric material.

3. The vertical cavity laser of claim 2 wherein the dielectric spacer layer comprises a layer of said high index of refraction dielectric material having an optical thickness substantially equal to $(\frac{1}{4}+N/2)\lambda$ where N is an integer and $\lambda$ is the nominal wavelength of light emitted by said optical cavity.

4. The vertical cavity laser of claim 3, wherein the semiconductor portion of the optical cavity has an optical thickness substantially equal to $(M/2-\frac{1}{4})\lambda$, where M is an integer greater than 1 and $\lambda$ is the nominal wavelength of light emitted by said optical cavity, such that the entire optical cavity has an optical thickness substantially equal to $(M/2)\lambda$.

5. The vertical cavity laser of claim 2 wherein the dielectric spacer layer comprises a layer of said low index of refraction dielectric material having an optical thickness substantially equal to $(\frac{1}{2}+N/2)\lambda$ where N is an integer and $\lambda$ is the nominal wavelength of light emitted by said optical cavity.

6. The vertical cavity laser of claim 5, wherein the semiconductor portion of the optical cavity has an optical thickness substantially equal to $(M/2-\frac{1}{2})\lambda$, where M is an integer greater than 1 and $\lambda$ is the nominal wavelength of light emitted by said optical cavity, such that the entire optical cavity has an optical thickness substantially equal to $(M/2)\lambda$.

7. The vertical cavity laser of claim 1 further comprising an intra-cavity contact coupled to said optical cavity.

8. The vertical cavity laser of claim 7 wherein the semiconductor portion of the optical cavity comprises a lower cladding region formed on said first mirror, an active region formed on said lower cladding region and a bulk doped or delta-doped upper cladding layer formed on said active region, wherein said intra-cavity contact is coupled to said delta-doped upper cladding layer.

9. The vertical cavity laser of claim 1 wherein said optical cavity comprises an active region comprising one or more quantum wells.

10. The vertical cavity laser of claim 9 wherein said one or more quantum wells comprise at least one element from Group III–V or Group II–VI semiconductor material.

11. A vertical cavity laser, comprising:
a semiconductor optical cavity adjacent to a first mirror; and
a hybrid mirror, comprising a plurality of semiconductor mirror layers adjacent to said optical cavity, a dielectric spacer layer adjacent to said semiconductor mirror layers and a plurality of dielectric mirror layers adjacent to said dielectric spacer layer, wherein the interface between the semiconductor mirror layers and the dielectric spacer layer is at or near a null in optical standing wave intensity pattern of said vertical cavity laser.

12. The vertical cavity laser of claim 11 wherein the plurality of dielectric mirror layers comprises alternating layers of a high index of refraction dielectric material and a low index of refraction dielectric material.

13. The vertical cavity laser of claim 12 wherein the dielectric spacer layer comprises a layer of said high index of refraction dielectric material having an optical thickness substantially equal to $(\frac{1}{4}+N/2)\lambda$ where N is an integer and $\lambda$ is the nominal wavelength of light emitted by said optical cavity, and wherein the semiconductor mirror layer adjacent the dielectric spacer layer has an optical thickness that is an integer multiple of $\lambda/2$.

14. The vertical cavity laser of claim 12 wherein the dielectric spacer layer comprises a layer of said low index of refraction dielectric material having an optical thickness substantially equal to $(\frac{1}{2}+N/2)\lambda$ where N is an integer and $\lambda$ is the nominal wavelength of light emitted by said optical cavity.

15. The vertical cavity laser of claim 11 wherein said optical cavity comprises an active region comprising one or more quantum wells.

16. The vertical cavity laser of claim 15 wherein said one or more quantum wells comprise at least one element from each of Group III and Group V compound semiconductor materials.

17. The vertical cavity laser of claim 15 wherein said one or more quantum wells comprise at least one element from each of Group II and Group VI compound semiconductor materials.

18. A method for forming a vertical cavity laser, comprising the steps of:
forming an optical cavity adjacent to a first mirror, the optical cavity comprising a semiconductor portion and a dielectric spacer layer; and forming a dielectric DBR adjacent to said dielectric spacer layer, wherein interface between the semiconductor portion of the optical cavity and the dielectric spacer layer is at a null in the optical standing wave intensity pattern of the vertical cavity laser.

19. The method claim 18 wherein the step of forming the dielectric DBR comprises forming alternating layers of a high index of refraction dielectric material and a low index of refraction dielectric material.

20. The method of claim 19 wherein the step of forming said dielectric spacer layer comprises forming a quarter wavelength thick layer of said high index of refraction dielectric material adjacent said semiconductor portion of the optical cavity.

21. The method of claim 19 wherein the step of forming the dielectric spacer layer comprises forming a half wavelength thick layer of said low index of refraction dielectric material adjacent said semiconductor portion of the optical cavity.

22. The method of claim 18 further electrically coupling an intra-cavity contact to said optical cavity.

23. The method of claim 18 wherein the step of forming said optical cavity comprises forming a lower cladding region adjacent said first mirror, forming an active region adjacent said lower cladding region and forming a bulk or delta-doped upper cladding layer adjacent said active region, wherein said intra-cavity contact is coupled to said bulk or delta-doped upper cladding layer.

24. The method of claim 23 wherein the step of forming said active region comprises the step of forming one or more quantum well layers.

25. The method of claim 24 wherein the step of forming said one or more quantum wells comprises forming one or more layers of a Group III–V semiconductor material.

26. The method of claim 24 wherein the step of forming said one or more quantum wells comprises forming one or more layers of a Group II–VI semiconductor material.

27. An optical subassembly comprising:
an electrical package containing a VCSEL having an optical cavity adjacent to a first mirror, the optical cavity comprising a semiconductor portion and a dielectric spacer layer, and a dielectric DBR adjacent to said dielectric spacer layer, wherein an interface between the semiconductor portion of the optical cavity and the dielectric spacer layer is at or near a null in the optical standing wave intensity pattern of said vertical cavity laser; and
a housing attached to the electrical package, the housing including a ferule for aligning a fiber with an optical path carrying light from the VCSEL.

28. The optical subassembly of claim 27 wherein the dielectric DBR comprises alternating layers of a high index of refraction dielectric material and a low index of refraction dielectric material.

29. The optical subassembly of claim 28 wherein the dielectric spacer layer comprises a layer of said high index of refraction dielectric material having an optical thickness substantially equal to $(\frac{1}{4}+N/2)\lambda$ where N is an integer and $\lambda$ is the nominal wavelength of light emitted by said optical cavity.

30. The optical subassembly of claim 27 wherein the dielectric spacer layer comprises a layer of said low index of refraction dielectric material having an optical thickness substantially equal to $(\frac{1}{2}+N/2)\lambda$ where N is an integer and $\lambda$ is the nominal wavelength of light emitted by said optical cavity.

* * * * *